(12) United States Patent
Jeon

(10) Patent No.: US 9,904,343 B2
(45) Date of Patent: Feb. 27, 2018

(54) SYSTEM ON CHIP CIRCUITS AND RELATED SYSTEMS AND METHODS OF OPERATING THE SAME

(71) Applicant: Samsung Electronics Co., Ltd., Suwon-si (KR)

(72) Inventor: Ho Yeon Jeon, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 14/557,507

(22) Filed: Dec. 2, 2014

(65) Prior Publication Data

US 2015/0153393 A1 Jun. 4, 2015

(30) Foreign Application Priority Data

Dec. 4, 2013 (KR) .......................... 10-2013-0150175

(51) Int. Cl.
*G06F 1/32* (2006.01)
*G06F 1/20* (2006.01)
*G01R 21/06* (2006.01)

(52) U.S. Cl.
CPC ............ *G06F 1/3203* (2013.01); *G06F 1/206* (2013.01); *G01R 21/06* (2013.01); *Y02B 60/1275* (2013.01)

(58) Field of Classification Search
CPC ......... G06F 1/3203; G06F 1/206; G11C 5/14; G11C 5/148; Y02B 10/1275; G01R 21/06
USPC ........... 702/60; 365/226, 227; 713/300, 320, 713/321, 340
See application file for complete search history.

(56) References Cited

U.S. PATENT DOCUMENTS

| 7,337,339 | B1 | 2/2008 | Choquette et al. |
| 8,060,765 | B1 | 11/2011 | Cha et al. |
| 8,275,560 | B2 | 9/2012 | Radhakrishnan et al. |
| 8,726,047 | B2* | 5/2014 | Lee ........................... G06F 1/26 713/300 |
| 2002/0194511 | A1 | 12/2002 | Swoboda |
| 2004/0044914 | A1 | 3/2004 | Gedeon |
| 2011/0291746 | A1 | 12/2011 | Ibrahim et al. |
| 2012/0054528 | A1 | 3/2012 | Bose et al. |
| 2012/0130657 | A1 | 5/2012 | Eckert et al. |
| 2013/0007473 | A1* | 1/2013 | van der Lee ........... G06F 1/206 713/300 |
| 2013/0091373 | A1 | 4/2013 | Luo et al. |
| 2013/0159734 | A1* | 6/2013 | Pan ....................... G06F 1/3296 713/300 |

(Continued)

FOREIGN PATENT DOCUMENTS

KR 10-2011-0114910 A 10/2011

*Primary Examiner* — Tan T Nguyen
(74) *Attorney, Agent, or Firm* — Ward & Smith, P.A.

(57) ABSTRACT

Methods of operating a system on chip including a first power domain and a second power domain are provided. The method includes measuring at least one of a voltage and a current, which are applied to the first power domain in analog mode to obtain a measurement result; calculating a first power consumed in the first power domain based on the measurement result; calculating a second power consumed in the second power domain in digital mode based on an activity of the second power domain; and controlling a total power of the system on chip based on the first power and the second power. At least one of the measuring, calculating a first power, calculating a second power and controlling are performed by at least one processor.

19 Claims, 11 Drawing Sheets

(56) References Cited

U.S. PATENT DOCUMENTS

| | | | |
|---|---|---|---|
| 2014/0143565 A1* | 5/2014 | Paul | G06F 1/206 713/320 |
| 2015/0006925 A1* | 1/2015 | Branover | G06F 1/3206 713/320 |
| 2016/0179164 A1* | 6/2016 | Park | G06F 1/324 713/322 |

* cited by examiner

SYSTEM ON CHIP CIRCUITS AND RELATED SYSTEMS AND METHODS OF OPERATING THE SAME

CROSS-REFERENCE TO RELATED APPLICATION

This application claims priority under 35 U.S.C. § 119(a) from Korean Patent Application No. 10-2013-0150175, filed Dec. 4, 2013, the disclosure of which is hereby incorporated herein by reference in its entirety.

BACKGROUND

Embodiments of the inventive concept relate to a system on chip (SoC), and more particularly, to a SoC for measuring and calculating power of at least one non-core power domain in analog mode and measuring and calculating power of at least one core power domain in digital mode.

As portable devices, such as smart phones and tablet personal computers (PCs) have recently come into wide use and the number of applications available in these devices has increased, approaches for controlling power consumed in the portable devices become important. It may be desirable to accurately measure total power consumed in a portable device.

SUMMARY

Some embodiments of the present inventive concept provide a system on chip (SoC) for calculating a total power in hybrid mode, i.e., using both analog and digital modes.

Further embodiments of the present inventive concept provide methods of operating a system on chip including a first power domain and a second power domain. The method includes measuring at least one of a voltage and a current, which are applied to the first power domain in analog mode to obtain a measurement result; calculating a first power consumed in the first power domain based on the measurement result; calculating a second power consumed in the second power domain in digital mode based on an activity of the second power domain; and controlling a total power of the system on chip based on the first power and the second power. At least one of the measuring, calculating a first power, calculating a second power and controlling are performed by at least one processor.

In still further embodiments, the first power domain may be a non-core power domain and the second power domain may be a core power domain including a processor.

In some embodiments, calculating the first power may include measuring a voltage difference corresponding to a voltage drop of a power switch connected to a power line of the first power domain; and calculating the first power based on the voltage difference, a resistance of the power switch, and a power supply voltage applied to the first power domain.

In further embodiments, calculating the first power may include measuring a total current supplied to the first power domain based on a current flowing in a power switch connected to a power line of the first power domain; and calculating the first power based on the measured total current and a power supply voltage applied to the first power domain.

In still further embodiments, calculating the first power may include converting the measurement result into a digital signal; and calculating the first power based on the digital signal and condition data related to the first power domain.

In some embodiments, calculating the second power may include calculating the second power based on parameters related to the activity, a weight of each of the parameters, and environmental conditions of the second power domain.

Further embodiments of the present inventive concept provide a system on chip (SoC) including a first power domain and a second power domain, The system on chip including a power monitoring circuit to measure at least one of a voltage and a current to provide a measurement result, the voltage or the current being applied to the first power domain in analog mode and to generate a digital signal based on the measurement result; a performance monitoring unit to monitor an activity of the second power domain; and a power calculation module to calculate a first power consumed in the first power domain based on the digital signal and calculate a second power consumed in the second power domain in digital mode based on the monitored activity.

In still further embodiments, the first power domain may be a non-core domain and the second power domain may be a core domain.

In some embodiments, the power calculation module may calculate the second power based on parameters related to the monitored activity, a weight of each of the parameters, and environmental conditions of the second power domain.

In further embodiments, a power management unit may control a total power of the system on chip based on the first power and the second power.

In still further embodiments, the first power domain may include a first peripheral circuit (PC1). The power monitoring circuit may include a controller; a first sensing circuit to sense at least one of a current and a voltage, the current and/or the voltage being applied to a power switch connected to a power line provided for the first peripheral circuit, and to output a first sensed signal based on a sensing result; and an analog-to-digital converter to convert the first sensed signal into the digital signal according to control of the controller.

In some embodiments, the first power domain may include a second peripheral circuit (PC2). The power monitoring circuit may further include a second sensing circuit to sense at least one of a current and a voltage, the current and/or the voltage being applied to a power switch connected to a power line provided for the second peripheral circuit, and to output a second sensed signal based on a sensing result; and a selector to select and output one of the first sensed signal and the second sensed signal according to the control of the controller, and the analog-to-digital converter to convert an output signal of the selector into the digital signal according to the control of the controller.

In further embodiments, a power management integrated circuit may control a total power of the system on chip based on the first power and the second power.

In still further embodiments, the first power domain may include a first peripheral circuit. The power monitoring circuit may include a controller; a first sensing circuit configured to sense at least one of a current and a voltage, the current and/or the voltage being applied to a power switch connected to a power line provided for the first peripheral circuit, and to output a first sensed signal based on a sensing result; and an analog-to-digital converter configured to convert the first sensed signal into the digital signal according to control of the controller.

In some embodiments, the first power domain may further include a second peripheral circuit. The power monitoring circuit may include a second sensing circuit to sense at least one of a current and a voltage, the voltage and/or the current being applied to a power switch connected to a power line provided for the second peripheral circuit, and to output a second sensed signal based on a sensing result; and a selector to select and output one of the first sensed signal and the second sensed signal according to the control of the controller, and the analog-to-digital converter to convert an output signal of the selector into the digital signal according to the control of the controller.

Further embodiments of the present inventive concept provide methods of operating a system on chip (SoC) including measuring a power consumed in a non-core power domain in a analog mode; measuring a power of a core power domain including a core processor in a digital mode; and calculating a total power based on the power consumed in a non-core power domain and the core power domain.

In still further embodiments, the method may further include controlling the total power and a total temperature of the SoC based on the power consumed in the non-core power domain and the core power domain.

In some embodiments, measuring power consumed in a non-core power domain may include measuring a voltage difference corresponding to a voltage drop of a power switch connected to a power line of the non-core power domain; and calculating the power consumed in the non-core power domain based on the voltage difference, a resistance of the power switch, and a power supply voltage applied to the non-core power domain.

In further embodiments, measuring the power of a core power domain may include calculating the power of the core power domain based on parameters related to an activity of the non-core power domain, a weight of each of the parameters, and environmental conditions of the core power domain.

BRIEF DESCRIPTION OF THE DRAWINGS

The above and other features and advantages of the inventive concept will become more apparent by describing in detail exemplary embodiments thereof with reference to the attached drawings in which.

DETAILED DESCRIPTION OF THE EMBODIMENTS

Figure 1:
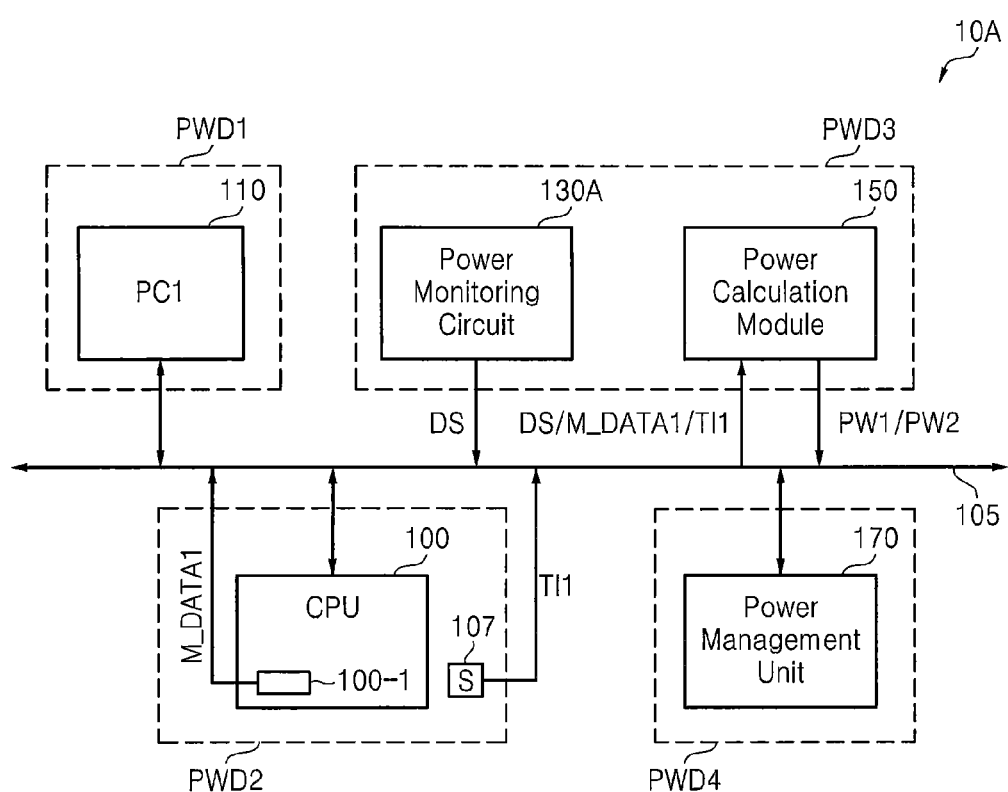
FIG. 1 is a block diagram of a system on chip (SoC) according to some embodiments of the inventive concept.

The inventive concept now will be described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system on chip (SoC) 10A according to some embodiments of the inventive concept. The SoC 10A may be implemented as a printed circuit board (PCB) such as a motherboard, an integrated circuit (IC), a processor, a multimedia processor, or an integrated multimedia processor. The SoC 10A may also be an application processor.

The SoC 10A may be divided into a plurality of power domains PWD1 through PWD4. The SoC 10A may measure at least one between voltage and current, which are provided to the first power domain PWD1, in analog mode and may calculate a first power PW1 consumed in the first power domain PWD1 based on the measurement result.

The SoC 10A may calculate a second power PW2 consumed in the second power domain PWD2 based on the activity of the second power domain PWD2. In addition, the SoC 10A may control the total power of the SoC 10A based on the first power PW1 and the second power PW2. The SoC 10A may include a central processing unit (CPU) 100, a first temperature sensor 107, a first peripheral circuit 110, a power monitoring circuit 130A, a power calculation module 150, and a power management unit 170.

As used herein, the term "module" may indicate hardware that can perform functions and operations in accordance with the following descriptions, computer program codes for executing particular functions and operations, or an electronic recording medium, for example, a processor equipped with the computer program codes. In other words, the "module" may indicate the functional and/or structural combination of hardware for realizing the inventive concept and/or software for driving the hardware. Each module may be referred to as a device or circuit without departing from the scope of the present inventive concept.

The first power domain PWD1 may include the first peripheral circuit 110. The second power domain PWD2 may include the CPU 100 and the first temperature sensor 107. The third power domain PWD3 may include the power monitoring circuit 130A and the power calculation module 150. The fourth power domain PWD4 may include the power management unit 170. Although the power monitoring circuit 130A and the power calculation module 150 are defined to belong to the same power domain in the embodiments illustrated in FIG. 1, they may be defined to belong to different power domains from each other in other embodiments. The power domains PWD1 through PWD4 may be defined depending on the function and/or power measuring method of each of the elements 100, 110, 130A, 150, and 170.

The CPU 100 may control the overall operation of the SoC 10A. For example, the CPU 100 may control the operation of each of the elements 110, 130A, 150, and 170 through a bus 105. The CPU 100 may be implemented as a multi-core. The multi-core may be a single computing component with two or more independent cores.

The CPU 100 may include a first performance monitoring unit 100-1. The first performance monitoring unit 100-1 may monitor the activity of the second power domain PWD2, for example, the CPU 100. For example, the first performance monitoring unit 100-1 may monitor parameters related to the activity of the CPU 100 and may transmit first monitoring data M_DATA1 obtained by monitoring the parameters to the power calculation module 150. The parameters may include an activity clock cycle, an integer/floating instruction counter, a load/store instruction counter, an L1/L2 cache access counter, a translation lookaside buffer (TLB) access counter, and a data cache access counter. Although the first performance monitoring unit 100-1 is implemented within the CPU 100 in the embodiments illustrated in FIG. 1, it may be implemented outside the CPU 100 in other embodiments.

The first temperature sensor 107 may sense heat generated in the second power domain PWD2, for example, the CPU 100 and measure temperature of the CPU 100. The first temperature sensor 107 may be a thermal sensor. The first temperature sensor 107 may output first temperature information TI1 about the measured temperature to the power calculation module 150.

In these embodiments, a peripheral circuit may be a function block except for core processors, for example, the CPU 100 and/or a graphics processing unit (GPU) used in the SoC 100. For example, the function block may be memory, universal serial bus (USB), peripheral component interconnect (PCI), digital signal processor (DSP), wired interface, wireless interface, controller, embedded software, codec, video module (for example, camera interface, Joint Photographic Experts Group (JPEG) processor, or video processor) or mixer, audio system, or driver. In other words, the second power domain PWD2 may be a core power domain including a processor (or a core processor), such as the CPU 100 and the other domains PWD1, PWD3, and PWD4 may be non-core power domains.

The power monitoring circuit 130A may measure at least one between voltage and current, provided to the first power domain PWD1, in analog mode; generate a digital signal DS based on the measurement result; and transmit the digital signal DS to the power calculation module 150. Regardless of what function block the first peripheral circuit 110 included in the first power domain PWD1 is implemented as, the power monitoring circuit 130A may directly measure data (or information), which is used by the power calculation module 150 to calculate the first power PW1, from the first power domain PWD1 using the analog mode. The structure and operation of the power monitoring circuit 130A will be discussed with reference to FIGS. 2 through 4 below.

The power calculation module 150 may calculate the first power PW1 consumed in the first power domain PWD1 based on the digital signal DS. The power calculation module 150 may also calculate the second power PW2 consumed in the second power domain PWD2 in digital mode based on the first monitoring data M_DATA1 and the first temperature information TI1.

For example, the power calculation module 150 may calculate the second power PW2 based on parameters (for example, the first monitoring data M_DATA1), weighted coefficient of each of the parameters, and environmental conditions (for example, the first temperature information TI1, frequency applied to the CPU 100, and/or voltage applied to the CPU 100) of the second power domain PWD2.

The power calculation module 150 calculates both the first power PW1 of the non-core power domain PWD1 including at least one first peripheral circuit 110, which performs a main function and/or operation of the SoC 10A, and the second power PW2 of the core power domain PWD2 including a process, for example, the CPU 100, thereby efficiently determining the total power of the SoC 10A. The power calculation module 150 may transmit the first power PW1 and the second power PW2 to the power management unit 170. According to some embodiments, the power calculation module 150 may operate according to the control of the CPU 100. The structure and operation of the power calculation module 150 will be discussed with reference to FIG. 5 below.

The power management unit 170 may control the total power of the SoC 10A based on the first power PW1 and the second power PW2. For example, the power management unit 170 may control the power state of each of the power domains PWD1 and PWD2. The power state may be a power-up (or power-on) state or a power-down (or power-off) state. The power-up state may indicate a state in which the power or voltage of the power domain PWD1 or PWD2 is fully powered up. The power-down state may indicate a state in which the power domain PWD1 or PWD2 is powered-off or is in a low-power mode. The power management unit 170 may also control temperature of the SoC 10A based on the first power PW1 and the second power PW2. The temperature may be controlled using a thermal throttling method according to some embodiments. Since the total power of the SoC 10A is accurately calculated using a hybrid method, the power management unit 170 efficiently controls the total power and/or temperature of the SoC 10A.

Figure 2:
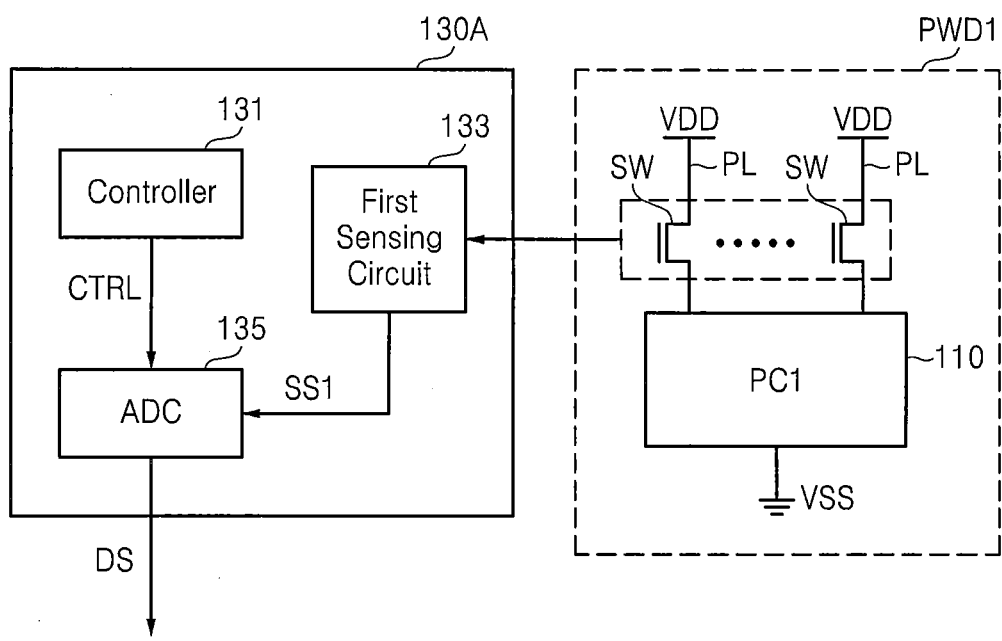
FIG. 2 is a block diagram illustrating operations of a power monitoring circuit illustrated in FIG. 1.

FIG. 2 is a block diagram illustrating operations of the power monitoring circuit 130A illustrated in FIG. 1. Referring to FIGS. 1 and 2, the first power domain PWD1 may also include power lines PL for application of a power supply voltage VDD to the first peripheral circuit 110. Each of the power lines PL may be connected to a power switch SW in the first power domain PWD1. The power switch SW may be implemented as a P-channel metal oxide semiconductor (PMOS) transistor or an N-channel MOS (NMOS) transistor.

The power monitoring circuit 130A may include a controller 131, a first sensing circuit 133, and an analog-to-digital converter (ADC) 135.

The controller 131 may control the overall operation of the power monitoring circuit 130A. For example, the controller 131 may control the operation of each of the elements 133 and 135. The controller 131 may generate a control signal CTRL and output the control signal CTRL to the ADC 135.

The first sensing circuit 133 may measure at least one between voltage and current, which are provided to the power switch SW connected to each of the power lines PL, and may output a first sensed signal SS1 based on the measurement result. In other words, the first sensing circuit 133 may be directly connected to each power line PL and may measure at least one between voltage and current provided to the power switch SW in analog mode.

Figure 3:
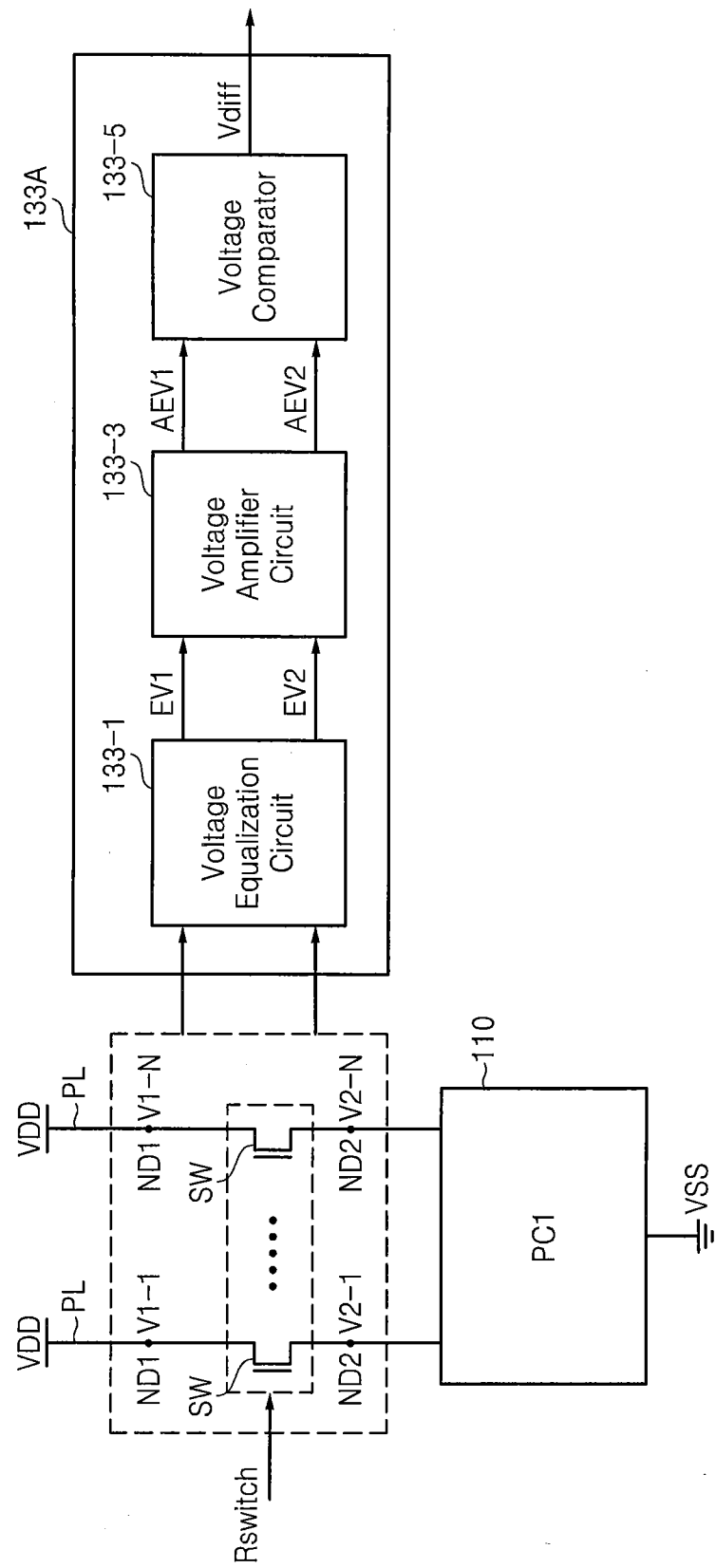
FIG. 3 is a block diagram illustrating an example of a first sensing circuit illustrated in FIG. 2.

FIG. 3 is a block diagram illustrating an example 133A of the first sensing circuit 133 illustrated in FIG. 2. Referring to FIG. 3, the first sensing circuit 133A may measure a voltage difference Vdiff corresponding to voltage drop of the power switch SW connected to each of the power lines PL in the first power domain PWD1.

The first sensing circuit 133A may include a voltage equalization circuit 133-1, a voltage amplifier circuit 133-3, and a voltage comparator 133-5. The first sensing circuit 133A illustrated in FIG. 3 illustrates an embodiment of the first sensing circuit 133 illustrated in FIG. 2.

The voltage equalization circuit 133-1 may measure voltages V1-1 through V1-N and V2-1 through V2-N applied to the power switches SW respectively connected to the power lines PL and generate equalized voltage EV1 and EV2 based on the measurement result. For example, the voltage equalization circuit 133-1 may measure the voltages V1-1 through V1-N applied to first ends ND1 of the respective power switches SW respectively connected to the power lines PL and may generate the first equalized voltage EV1 by equalizing the voltages V1-1 through V1-N. The voltage equalization circuit 133-1 may also measure the voltages V2-1 through V2-N applied to second ends ND2 of the respective power switches SW respectively connected to the power lines PL and may generate the second equalized voltage EV2 by equalizing the voltages V2-1 through V2-N. The voltage equalization circuit 133-1 may output the first equalized voltage EV1 and the second equalized voltage EV2 to the voltage amplifier circuit 133-3.

The voltage amplifier circuit 133-3 may amplify the first equalized voltage EV1 and the second equalized voltage EV2, thereby generating amplified voltages AEV1 and AEV2. For example, the voltage amplifier circuit 133-3 may generate the first amplified voltage AEV1 by amplifying the first equalized voltage EV1 and may generate the second amplified voltage AEV2 by amplifying the second equalized voltage EV2. The voltage amplifier circuit 133-3 may output the first amplified voltage AEV1 and the second amplified voltage AEV2 to the voltage comparator 133-5.

The voltage comparator 133-5 may compare the first amplified voltage AEV1 with the second amplified voltage AEV2 and may generate the voltage difference Vdiff corresponding to the voltage drop of the power switches SW according to the comparison result. The voltage comparator 133-5 may output the voltage difference Vdiff to the ADC 135 as the first sensed signal SS1.

A resistance Rswitch illustrated in FIG. 3 may be a total parallel resistance looking at the power switch SW of each power line PL connected to the first peripheral circuit 110.

Figure 4:
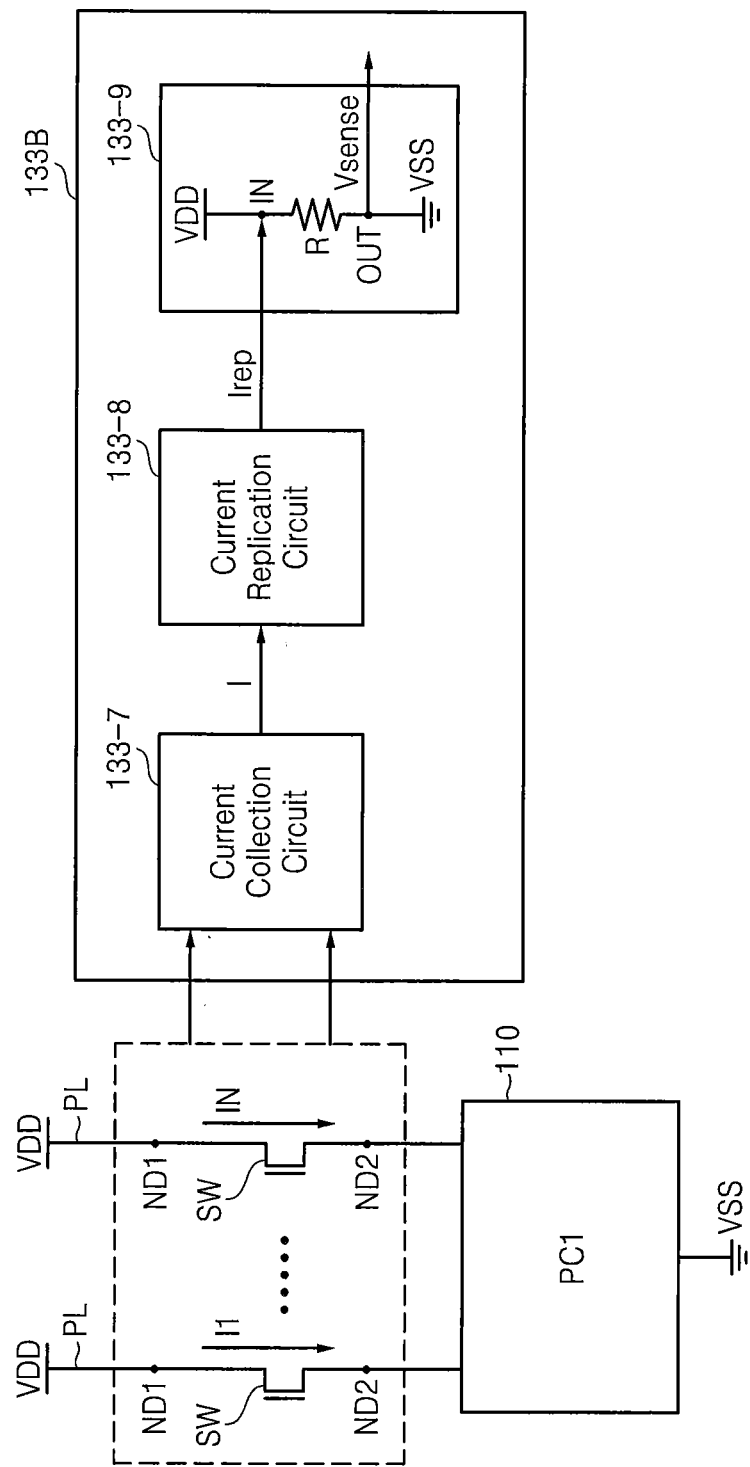
FIG. 4 is a block diagram illustrating another example of a first sensing circuit illustrated in FIG. 2.

FIG. 4 is a block diagram for explaining another example 133B of the first sensing circuit 133 illustrated in FIG. 2. Referring to FIG. 4, the first sensing circuit 133B may measure a total current I supplied to the first power domain PWD1, for example, the first peripheral circuit 110, based on currents I1 through IN (where N is a natural number of at least 1) supplied to the power switch SW connected to each of the power lines PL in the first power domain PWD1.

The first sensing circuit 133B may include a current collection circuit 133-7, a current replication circuit 133-8, and a resistance circuit 133-9. The first sensing circuit 133B illustrated in FIG. 4 illustrates some embodiments of the first sensing circuit 133 illustrated in FIG. 2.

The current collection circuit 133-7 may collect the currents I1 through IN supplied to the respective power switches SW respectively connected to the power lines PL and may generate the total current I by adding the collected currents I1 through IN. The current collection circuit 133-7 may output the total current I to the current replication circuit 133-8.

The current replication circuit 133-8 may generate a replica current Irep with respect to the total current I using current mirroring. The replica current Irep may be defined as Equation 1:

$$Irep = \frac{1}{M} \times I, \qquad (1)$$

where M may be a scale down constant of at least 1. The current replication circuit 133-8 may output the replica current Irep to the resistance circuit 133-9.

The resistance circuit 133-9 may include an input node IN, an output node OUT, and a resistor R. The replica current Irep may be input to the input node IN of the resistance circuit 133-9 and flow across the resistor R, thereby causing voltage drop. Due to the voltage drop, an output voltage Vsense may be put across the output node OUT of the resistance circuit 133-9. The output voltage Vsense may be defined as Equation 2:

$$Vsense = VDD - Irep \times Rv, \qquad (2)$$

where Rv may be a resistance of the resistor R. The resistance circuit 133-9 may output the output voltage Vsense to the ADC 135 as the first sensed signal SS1.

Since the total current I actually supplied to the first peripheral circuit 110 is significantly large, it is hard to directly measure the total current I. Therefore, the total current I may be measured based on the replica current Irep obtained by scaling down the total current I using the current replication circuit 133-8. Referring to FIGS. 1 through 4, the ADC 135 may convert the first sensed signal SS1 into the digital signal DS according to the control of the controller 131, i.e., in response to the control signal CTRL. The ADC 135 may output the digital signal DS to the power calculation module 150.

Figure 5:
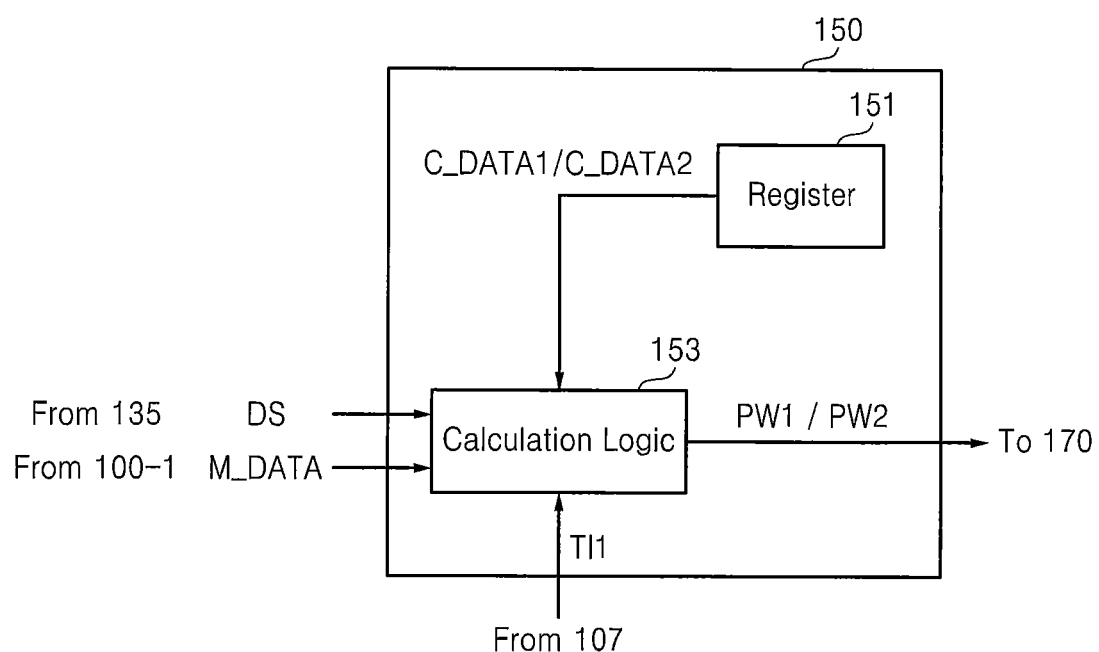
FIG. 5 is a block diagram of a power calculation module illustrated in FIG. 1.

FIG. 5 is a block diagram of the power calculation module 150 illustrated in FIG. 1. Referring to FIGS. 1 through 5, the power calculation module 150 may include a register 151 and calculation logic 153.

The register 151 may store first condition data C_DATA1 used to calculate the first power PW1 consumed in the first power domain PWD1. The first condition data C_DATA1 may be data related to the first power domain PWD1. For example, the first condition data C_DATA1 may include the total parallel resistance Rswitch, the scale down constant M, the resistance Rv of the resistor R of the resistance circuit 133-9, and/or data about the power supply voltage VDD.

The register 151 may store second condition data C_DATA2 used to calculate the second power PW2 consumed in the second power domain PWD2. The second condition data C_DATA2 may be data related to the second power domain PWD2, for example, the CPU 100. For example, the second condition data C_DATA2 may include data about a weight of each of parameters related to the activity of the second power domain PWD2, for example, the CPU 100; data about a weight of the measured temperature of the CPU 100, and data about environmental conditions (for example, frequency and/or voltage applied to the CPU 100) of the second power domain PWD2. The first condition data C_DATA1 and the second condition data C_DATA2 may be set in the register 151 according to the control of the CPU 100 according to some embodiments.

The calculation logic 153 may calculate the first power PW1 consumed in the first power domain PWD1 based on the digital signal DS. For example, the calculation logic 153 may calculate the first power PW1 consumed in the first power domain PWD1 using the digital signal DS and the first condition data C_DATA1.

When the power monitoring circuit 130A measures the voltages V1-1 through V1-N and V2-1 through V2-N applied to the ends ND1 and ND2 of the power switches SW of the respective power lines PL included in the first power domain PWD1 in analog mode, the first power PW1 consumed in the first power domain PWD1 may be calculated using Equation 3:

$$PW1 = V\text{diff} \times R\text{switch} \times VDD. \quad (3)$$

When the power monitoring circuit 130A measures the currents I1 through IN applied to the ends ND1 and ND2 of the power switches SW of the respective power lines PL included in the first power domain PWD1 in analog mode, the first power PW1 consumed in the first power domain PWD1 may be calculated using Equation 4:

$$PW1 = I \times VDD. \quad (4)$$

The total current I may be calculated using Equations 1 and 2.

The calculation logic 153 may calculate the second power PW2 consumed in the second power domain PWD2 using monitoring data M_DATA, the temperature information TI, and the second condition data C_DATA2. The second power PW2 may be calculated using Equation 5:

$$PW2 = A1 \times P1 + \ldots + AK \times PK + b \times \exp(c \times T). \quad (5)$$

Terms relevant to the parameters A1 through AK (where K is a natural number greater than 1) related to the activity of the second power domain PWD2, for example, the CPU 100 and terms relevant to the weights P1 through PK of the respective parameters A1 through AK may be related with dynamic power. Terms relevant to the measured temperature T and the weights "b" and "c" of the measured temperature T may be related with leakage current.

The calculation logic 153 may calculate the dynamic power of the second power domain PWD2 using the monitoring data M_DATA and the second condition data C_DATA2. The calculation logic 153 may also calculate the leakage current of the second power domain PWD2 using the temperature information TI and the second condition data C_DATA2. The calculation logic 153 may calculate the second power PW2 consumed in the second power domain PWD2 by adding the dynamic power and the leakage power. The calculation logic 153 may output the first power PW1 and the second power PW2 to the power management unit 170.

Figure 6:
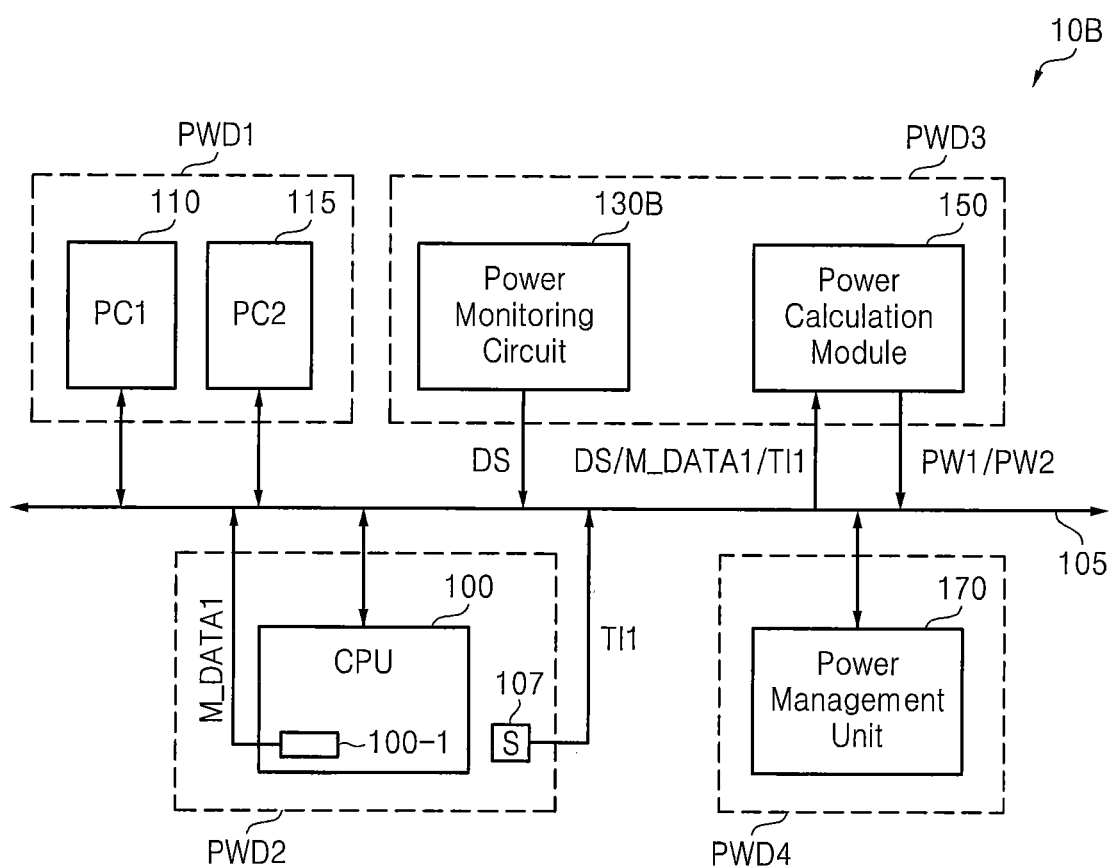
FIG. 6 is a block diagram of a SoC according to some embodiments of the inventive concept.

FIG. 6 is a block diagram of a SoC 10B according to other embodiments of the inventive concept. The SoC 10B may include the CPU 100, the first temperature sensor 107, the first peripheral circuit 110, a second peripheral circuit 115, a power monitoring circuit 130B, the power calculation module 150, and the power management unit 170. Apart from the structure and operations of the second peripheral circuit 115 and the power monitoring circuit 130B, the structure and operations of the SoC 10B illustrated in FIG. 6 may be substantially the same as those of the SoC 10A illustrated in FIG. 1.

The first power domain PWD1 may include the first peripheral circuit 110 and the second peripheral circuit 115. In other embodiments, different power domains may be defined for the first peripheral circuit 110 and the second peripheral circuit 115, respectively.

The second peripheral circuit 115 may be a function block except for core processors, for example, the CPU 100 and/or a GPU used in the SoC 10B. The power monitoring circuit 130B may measure at least one between voltage and current, provided to the first power domain PWD1, in analog mode; generate the digital signal DS based on the measurement result; and transmit the digital signal DS to the power calculation module 150.

Figure 7:
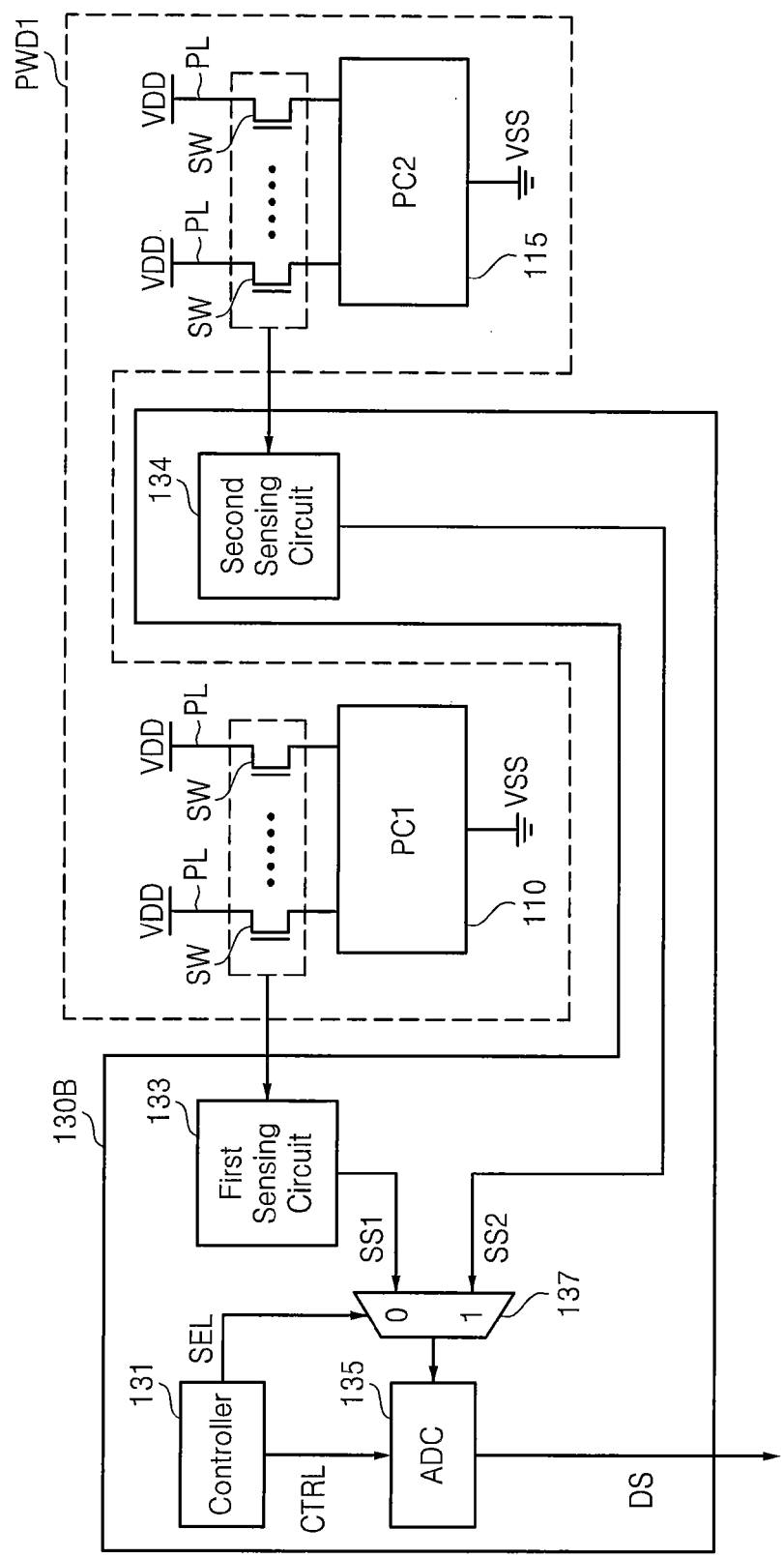
FIG. 7 is a block diagram for explaining the operation of a power monitoring circuit illustrated in FIG. 6.

FIG. 7 is a block diagram for explaining the operation of the power monitoring circuit 130B illustrated in FIG. 6. Referring to FIGS. 6 and 7, the first power domain PWD1 may also include power lines PL for application of the power supply voltage VDD to the second peripheral circuit 115. Each of the power lines PL for applying the power supply voltage VDD to the second peripheral circuit 115 may be connected to a power switch SW. According to some embodiments, the power switch SW for the second peripheral circuit 115 may be implemented as a PMOS transistor or an NMOS transistor. The power monitoring circuit 130B may include the controller 131, the first sensing circuit 133, a second sensing circuit 134, the ADC 135, and a selector 137.

The controller 131 may control the overall operation of the power monitoring circuit 130B. For example, the controller 131 may control the operation of each of the elements 133, 134, 135, and 137. The controller 131 may generate a control signal CTRL and output the control signal CTRL to the ADC 135. The controller 131 may generate a selection signal SEL and output the selection signal SEL to the selector 137.

The first sensing circuit 133 may measure at least one between voltage and current, which are provided to the power switch SW connected to each of the power lines PL provided for the first peripheral circuit 110, and may output the first sensed signal SS1 to the ADC 135 based on the measurement result. The second sensing circuit 134 may measure at least one between voltage and current, which are provided to the power switch SW connected to each of the power lines PL provided for the second peripheral circuit 115, and may output a second sensed signal SS2 to the ADC 135 based on the measurement result. The structure and operations of the second sensing circuit 134 may be substantially the same as those of the first sensing circuit 133.

For example, the second sensing circuit 134 may be implemented as the sensing circuit 133A or 133B illustrated in FIG. 3 or 4.

The selector 137 may output the first sensed signal SS1 or the second sensed signal SS2 to the ADC 135 according to the control of the controller 131, . . . , in response to the selection signal SEL. When the selection signal SEL is at a first level, for example, logic 0 or logic low, the selector 137 may output the first sensed signal SS1 received from the first sensing circuit 133 to the ADC 135. When the selection signal SEL is at a second level, for example, logic 1 or logic high, the selector 137 may output the second sensed signal SS2 received from the second sensing circuit 134 to the ADC 135. In other words, the selector 137 may sequentially select and output the first sensed signal SS1 and the second sensed signal SS2 according to the control of the controller 131. The selector 137 may be implemented as a multiplexer.

When the selector 137 is implemented in the power monitoring circuit 130B, it is not necessary to provide the controller 131 and/or the ADC 135 for each of the peripheral circuits 110 and 115, so that an area occupied by the power monitoring circuit 130B in the SoC 10B is reduced.

The ADC 135 may convert the output signal SS1 or SS2 of the selector 137 into the digital signal DS according to the control of the controller 131, i.e., in response to the control signal CTRL and may output the digital signal DS to the power calculation module 150. For example, according to the control of the controller 131 the ADC 135 may convert the first sensed signal SS1 into the digital signal DS and output the first sensed signal SS1 to the power calculation module 150 and then the ADC 135 may convert the second sensed signal SS2 into the digital signal DS and output the second sensed signal SS2 to the power calculation module 150.

The power calculation module 150 may calculate the first power PW1 consumed in the first power domain PWD1 based on the digital signal DS. For example, the power calculation module 150 may calculate a power consumed in the first peripheral circuit 110 and a power consumed in the second peripheral circuit 115 based on the digital signals DS sequentially received and may add the calculated powers to calculate the first power PW1 consumed in the first power domain PWD1.

Figure 8:
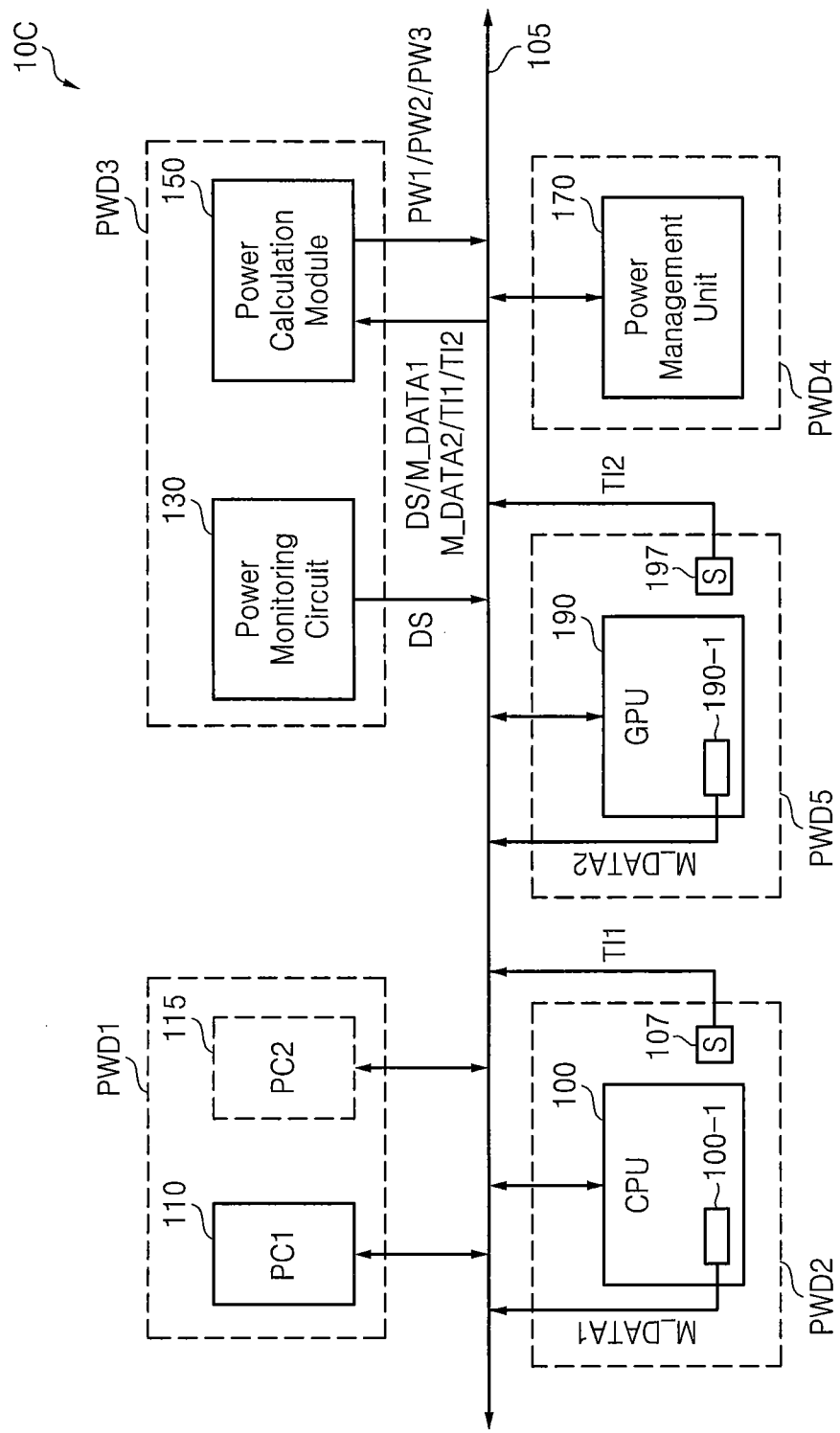
FIG. 8 is a block diagram of a SoC according to some embodiments of the inventive concept.

FIG. 8 is a block diagram of a SoC 10C according to some embodiments of the inventive concept. The SoC 10C may include the CPU 100, the first temperature sensor 107, the first peripheral circuit 110, the power monitoring circuit 130A or 130B (generically denoted by 130), the power calculation module 150, the power management unit 170, a GPU 190, and a second temperature sensor 197. The SoC 10C may also include the second peripheral circuit 115. Apart from the structure and operations of the GPU 190, the structure and operations of the SoC 10C illustrated in FIG. 8 may be substantially the same as those of the SoC 10A illustrated in FIG. 1 or the SoC 10B illustrated in FIG. 6. The SoC 10C may be divided into a plurality of power domains PWD1 through PWD5.

The power domains PWD1 through PWD5 may be defined depending on the function and/or power measuring method of each of the elements 100, 110, 130, 150, 170, and 190. The fifth power domain PWD5 may include the GPU 190 and the second temperature sensor 197. The GPU 190 may perform operations related to graphics processing. The GPU 190 may include a second performance monitoring unit 190-1.

The second performance monitoring unit 190-1 may monitor the activity of the fifth power domain PWD5, for example, the GPU 190. For example, the second performance monitoring unit 190-1 may monitor parameters related to the activity of the GPU 190 and may transmit second monitoring data M_DATA2 obtained by monitoring the parameters to the power calculation module 150. Although the second performance monitoring unit 190-1 is implemented within the GPU 190 in the embodiments illustrated in FIG. 8, it may be implemented outside the GPU 190 in other embodiments.

The second temperature sensor 197 may sense heat generated in the fifth power domain PWD5, for example, the GPU 190 and measure a temperature of the GPU 190. The second temperature sensor 197 may be a thermal sensor. The second temperature sensor 197 may output second temperature information TI2 about the measured temperature of the GPU 190 to the power calculation module 150.

The power calculation module 150 may digitally calculate a third power PW3 consumed in the fifth power domain PWD5 based on the second monitoring data M_DATA2 and the second temperature information TI2. For example, the power calculation module 150 may calculate the third power PW3 based on the parameters (for example, the second monitoring data M_DATA2) related to the activity of the GPU 190, a weight of each of the parameters, and environmental conditions (for example, the second temperature information TI2, frequency applied to the GPU 190, and/or voltage applied to the GPU 190) of the fifth power domain PWD5.

A method of calculating the third power PW3 in digital mode may be the same as that discussed above with reference to FIG. 5. At this time, the register 151 of the power calculation module 150 may store third condition data used to calculate the third power PW3. The third condition data may be data related to the fifth power domain PWD5. For example, the third condition data may include data about a weight of each of the parameters related to the activity of the fifth power domain PWD5, for example, the GPU 190, data about a weight of the measured temperature of the GPU 190, and data about the environmental conditions (for example, frequency and/or voltage applied to the GPU 190) of the fifth power domain PWD5.

Figure 9:
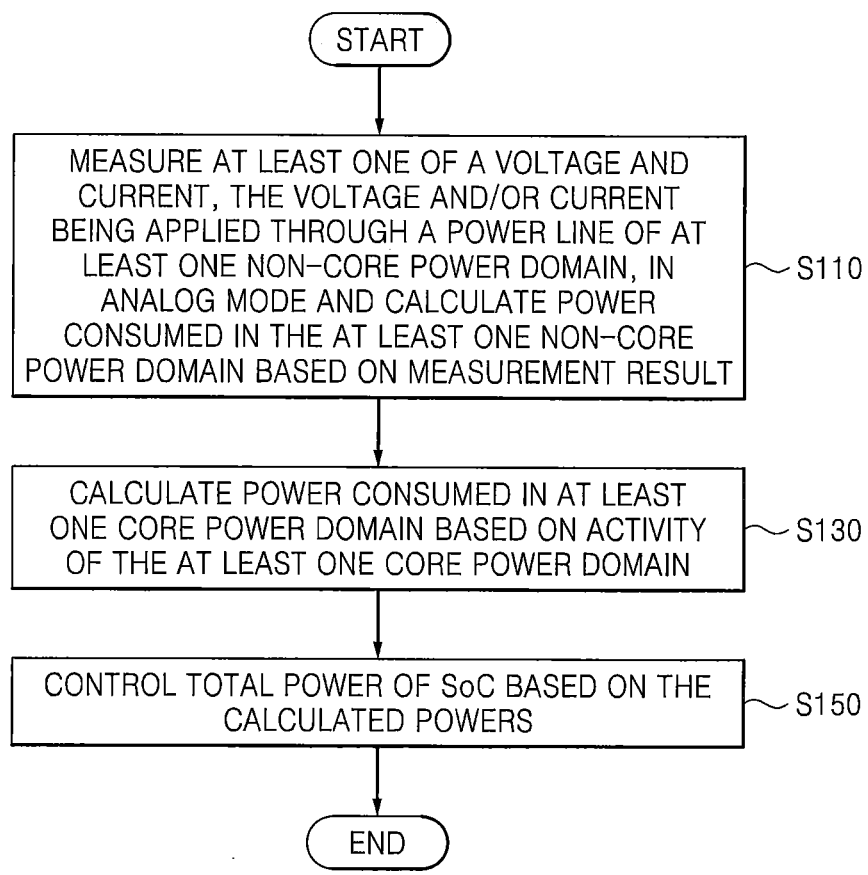
FIG. 9 is a flowchart of illustrating a method of operating the SoC illustrated in FIG. 1, 6, or 8 according to some embodiments of the inventive concept.

FIG. 9 is a flowchart illustrating operations of the SoC 10A, 10B, or 10C (generically denoted by 10) illustrated in FIG. 1, 6, or 8 according to some embodiments of the inventive concept. Referring to FIG. 9, the SoC 10 may include a plurality of the power domains PWD1, PWD2, PWD3, PWD4, and/or PWD5.

The SoC 10 may measure at least one between voltage and current provided to at least one non-core power domain PWD1 in analog mode and calculate the power PW1 consumed in the least one non-core power domain PWD1 based on the measurement result in operation S110. The SoC 10 may calculate at least one power PW2 and/or PW3 consumed in at least one core power domain PWD2 and/or PWD5 based on the activity of the at least one core power domain PWD2 and/or PWD5 in digital mode in operation S130. The SoC 10 may control its total power based on the calculated powers PW1 and PW2 and/or PW3 in operation S150.

Figure 10:
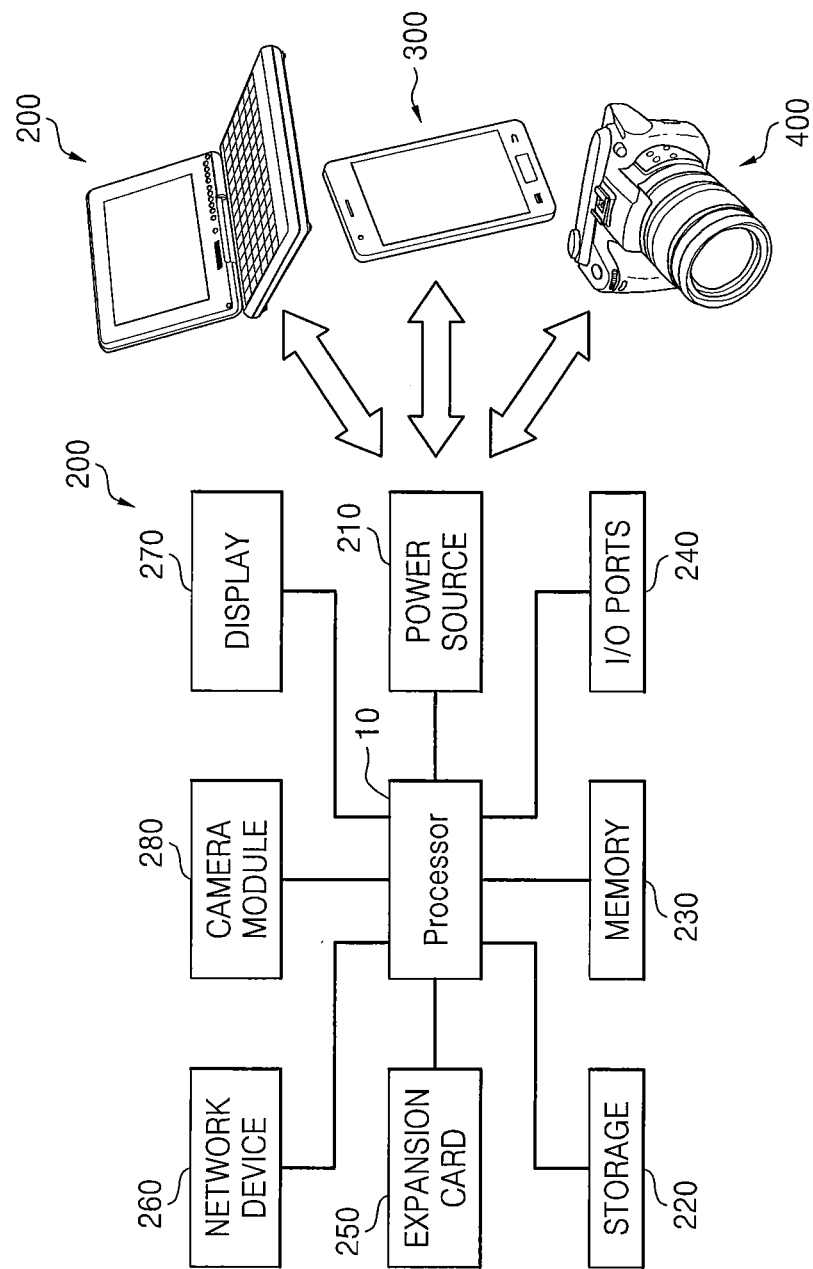
FIG. 10 is a block diagram of an electronic system according to some embodiments of the inventive concept.

FIG. 10 is a block diagram of an electronic system 200, 300, or 400 according to some embodiments of the inventive concept. Referring to FIG. 10, the electronic system 200, 300, or 400 may be implemented as a personal computer (PC), a data server, or a portable electronic device. The portable electronic device 300 may be implemented as a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book.

The electronic system 200, 300, or 400 may include the processor 10, a power source 210, a storage device 220, a memory 230, input/output (I/O) ports 240, an expansion card 250, a network device 260, and a display 270. The electronic system 200, 300, or 400 may also include a camera module 280.

The processor 10 may be the SoC 10 illustrated in FIG. 1, 6, or 8. The processor 10 may be a multi-core processor. The processor 10 may control the operation of at least one of the elements 210 through 280.

The power source 210 may supply an operating voltage to at least one of the elements 10 and 220 through 280. The storage device 220 may be implemented as a hard disk drive (HDD) or a solid state drive (SSD).

The memory 230 may be implemented as a non-volatile memory that can store a program code for controlling the operation of the processor 10 or a volatile memory that can store data. The non-volatile memory may be flash memory, an embedded multimedia card (eMMC), and a universal flash storage (UFS). The volatile memory may be dynamic random access memory (DRAM).

According to some embodiments, a memory controller (not shown) that controls a data access operation, for example, a read operation, a write operation (or a program operation), or an erase operation, on the memory 230 may be integrated into or embedded in the processor 10. Alternatively, the memory controller may be provided between the processor 10 and the memory 230.

The I/O ports 240 may receive data from the electronic system 200, 300, or 400 or transmit data from the electronic system 200, 300, or 400 to an external device. For example, the I/O ports 240 may include a port for connection with a pointing device such as a computer mouse or a touch pad, a port for connection with an output device such as the display 270 or a printer, a port for connection with an input device such as a keypad or a keyboard, and/or a port for connection with a USB drive.

The expansion card 250 may be implemented as a secure digital (SD) card or a multimedia card (MMC). According to embodiments, the expansion card 250 may be a subscriber identity module (SIM) card or a universal SIM (USIM) card.

The network device 260 may enable the electronic system 200, 300, or 400 to be connected with a wired or wireless network for communication with an external device. The display 270 may display data output from the storage device 220, the memory 230, the I/O ports 240, the expansion card 250, or the network device 260.

The camera module 280 is a module that can convert an optical image into an electrical image. Accordingly, the electrical image output from the camera module 280 may be stored in the storage device 220, the memory 230, or the expansion card 250. In addition, the electrical image output from the camera module 280 may be displayed through the display 270.

Figure 11:
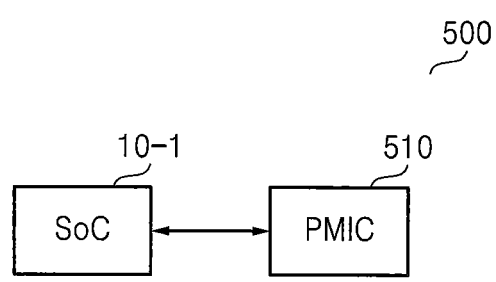
FIG. 11 is a block diagram of an electronic system according to some embodiments of the inventive concept.

FIG. 11 is a block diagram of an electronic system 500 according to other embodiments of the inventive concept. Referring to FIG. 11, the electronic system 500 may be implemented as a portable electronic device. The portable electronic device may be implemented as a laptop computer, a mobile telephone, a smart phone, a tablet PC, a PDA, an EDA, a digital still camera, a digital video camera, a PMP, a PND, a handheld game console, or an e-book.

The electronic system 500 may include a SoC 10-1 and a power management integrated circuit (PMIC) 510. Unlike the SoC 10 illustrated in FIG. 1, 6, or 8, the SoC 10-1 illustrated in FIG. 11 may not include the power management unit 170 therein. In other words, the total power of the SoC 10-1 may be controlled by a separate voltage management circuit, for example, the PMIC 510 implemented outside the SoC 10-1.

As discussed above, according to some embodiments of the inventive concept, a SoC measures a power consumed in a non-core power domain in analog mode and measures a power of a core power domain including a core process in digital mode regardless of a peripheral circuit included in the non-core power domain. Therefore, the total power of the SoC is efficiently and accurately measured in hybrid mode. Consequently, the total power and temperature of the SoC is efficiently controlled.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A method of operating a system on chip including a first power domain and a second power domain, the method comprising:

measuring at least one of a voltage and a current at a sensing circuit of a power monitoring unit, the at least one of the voltage and the current being applied to a power switch connected to a power line in the first power domain in analog mode to obtain a measurement result, and generating a digital signal based on the measurement result;

monitoring parameters related to an activity of the second power domain to obtain a monitoring result and generating monitoring data based on the monitoring result, wherein the monitoring data is different than the voltage and the current;

determining a total power of the system on chip at a power calculation module including a register and calculation logic by calculating a first power consumed in the first power domain based on the digital signal received at the calculation logic and first condition data received at the calculation logic from the register and a second power consumed in the second power domain in digital mode based on the monitoring data received at the calculation logic and second condition data received at the calculation logic from the register, wherein the register stores the first condition data and the second condition data and wherein the first and the second condition data is different from the monitoring data, the voltage and the current; and controlling a power state of each of the first power domain and the second power domain based on the first power and the second power at a power management unit, wherein at least one of the measuring, monitoring, generating, determining, calculating a first power, calculating a second power and controlling are performed by at least one processor.

2. The method of claim 1, wherein the first power domain is a non-core power domain and the second power domain is a core power domain including a processor.

3. The method of claim 1, wherein calculating the first power comprises:

measuring a voltage difference corresponding to a voltage drop of a power switch connected to a power line of the first power domain; and calculating the first power based on the voltage difference, a resistance of the power switch, and a power supply voltage applied to the first power domain.

4. The method of claim 1, wherein calculating the first power comprises:

measuring a total current supplied to the first power domain based on a current flowing in a power switch connected to a power line of the first power domain; and calculating the first power based on the measured total current and a power supply voltage applied to the first power domain.

5. The method of claim 1, wherein calculating the first power comprises:

converting the measurement result into a digital signal; and calculating the first power based on the digital signal and condition data related to the first power domain.

6. The method of claim 1, wherein the second condition data comprises a weight of each of the parameters and environmental conditions of the second power domain.

7. The method of claim 1, wherein monitoring parameters comprises monitoring at least one of an activity clock cycle, an integer/floating instruction counter, a load/store instruction counter, an L1/L2 cache access counter, a translation lookaside buffer (TLB) access counter, and a data cache access counter.

8. A system on chip (SoC) including a first power domain and a second power domain, the system on chip comprising:

a power monitoring circuit configured to measure at least one of a voltage and a current to provide a measurement result, the at least one voltage or the current being applied to a power switch connected to a power line in the first power domain in analog mode and to generate a digital signal based on the measurement result;

a performance monitoring unit configured to monitor parameters related to an activity of the second power domain to obtain a monitoring result and generating monitoring data based on the monitoring result, wherein the monitoring data is different than the voltage and the current; and a power calculation module including a register and calculation logic, the power calculation module configured to calculate a first power consumed in the first power domain based on the digital signal received at the calculation logic and first condition data received at the calculation logic from the register and calculate a second power consumed in the second power domain in digital mode based on the monitoring data received at the calculation logic and second condition data received at the calculation logic from the register such that a power calculation module determines a total power of the system on chip, wherein the register stores the first condition data and the second condition data wherein the first and the second condition data is different from the monitoring data, the voltage and the current.

9. The SoC of claim 8, wherein the first power domain is a non-core domain and the second power domain is a core domain.

10. The SoC of claim 8, wherein the second condition data comprises a weight of each of the parameters and environmental conditions of the second power domain.

11. The SoC of claim 8, further comprising a power management unit to control a total power of the system on chip based on the first power and the second power.

12. The SoC of claim 8:

wherein the first power domain comprises a first peripheral circuit; and wherein the power monitoring circuit comprises:

a controller;

a first sensing circuit to sense at least one of a current and a voltage, the current and/or the voltage being applied to the power switch connected to the power line provided for the first peripheral circuit, and to output a first sensed signal based on a sensing result; and an analog-to-digital converter to convert the first sensed signal into the digital signal according to control of the controller.

13. The SoC of claim 12:

wherein the first power domain further comprises a second peripheral circuit; and wherein the power monitoring circuit further comprises:

a second sensing circuit to sense at least one of a current and a voltage, the current and/or the voltage being applied to the power switch connected to the power line provided for the second peripheral circuit, and to output a second sensed signal based on a sensing result; and a selector to select and output one of the first sensed signal and the second sensed signal according to the control of the controller, and wherein the analog-to-digital converter converts to an output signal of the selector into the digital signal according to the control of the controller.

14. A system comprising:

the system on chip of claim 8; and a power management integrated circuit configured to control a total power of the system on chip based on the first power and the second power.

15. The system of claim 14:

wherein the first power domain comprises a first peripheral circuit; and wherein the power monitoring circuit comprises:

a controller;

a first sensing circuit configured to sense at least one of a current and a voltage, the current and/or the voltage being applied to the power switch connected to the power line provided for the first peripheral circuit, and to output a first sensed signal based on a sensing result; and an analog-to-digital converter configured to convert the first sensed signal into the digital signal according to control of the controller.

16. The system of claim 15:

wherein the first power domain further comprises a second peripheral circuit; and wherein the power monitoring circuit comprises:

a second sensing circuit to sense at least one of a current and a voltage, the voltage and/or the current being applied to the power switch connected to the power line provided for the second peripheral circuit, and to output a second sensed signal based on a sensing result; and a selector to select and output one of the first sensed signal and the second sensed signal according to the control of the controller, and wherein the analog-to-digital converter converts an output signal of the selector into the digital signal according to the control of the controller.

17. A method of operating a system on chip (SoC) comprising:

calculating a power consumed in a non-core power domain in an analog mode;

calculating a power of a core power domain including a core processor in a digital mode; and calculating, at power calculation module, a total power based on the power consumed in a non-core power domain and the core power domain, the power calculation module including a register and calculation logic, separate from the register, wherein the register in the power calculation module stores first condition data and second condition data, the first condition data being used by the calculation logic to calculate the power of the core power domain and the second condition data being by used by the calculation logic to calculate the power of the non-core power domain; and wherein the first condition data comprises parameters related to an activity of the core power domain, a weight of each of the parameters, and environmental conditions of the core power domain.

18. The method of claim 17, further comprising controlling the total power and a total temperature of the SoC based on the power consumed in the non-core power domain and the core power domain.

19. The method of claim 17, wherein measuring power consumed in a non-core power domain comprises:

measuring a voltage difference corresponding to a voltage drop of a power switch connected to a power line of the non-core power domain; and calculating the power consumed in the non-core power domain based on the second condition data including voltage difference, a resistance of the power switch, and/or a power supply voltage applied to the non-core power domain.

* * * * *